(12) United States Patent
Liu et al.

(10) Patent No.: US 11,181,592 B2
(45) Date of Patent: Nov. 23, 2021

(54) RADIO-FREQUENCY POWER CONVERTER AND RADIO-FREQUENCY TRANSMISSION SYSTEM FOR MAGNETIC RESONANCE IMAGING

(71) Applicant: GE Precision Healthcare LLC, Wauwatosa, WI (US)

(72) Inventors: Yu Liu, Beijing (CN); Kai Wang, Beijing (CN); Haoyang Xing, Beijing (CN); Xianchao Wu, Beijing (CN); Xin Xie, Beijing (CN); Dongliang Yang, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 5 days.

(21) Appl. No.: 16/944,249

(22) Filed: Jul. 31, 2020

(65) Prior Publication Data
US 2021/0063514 A1 Mar. 4, 2021

(30) Foreign Application Priority Data
Aug. 30, 2019 (CN) .......................... 201910814431.4

(51) Int. Cl.
*G01R 33/36* (2006.01)
*H03F 3/21* (2006.01)

(52) U.S. Cl.
CPC ..... *G01R 33/3621* (2013.01); *G01R 33/3607* (2013.01); *G01R 33/3614* (2013.01); *H03F 3/21* (2013.01); *H03F 2200/451* (2013.01)

(58) Field of Classification Search
CPC .......... G01R 33/3607; G01R 33/3614; G01R 33/3621; H03F 3/21; H03F 2200/451
See application file for complete search history.

(56) References Cited

U.S. PATENT DOCUMENTS

| 7,907,043 B2 | 3/2011 | Mori |
| 2010/0117737 A1* | 5/2010 | Kondo .................... H03F 1/565 330/276 |
| 2013/0293295 A1 | 11/2013 | Noh |
| 2013/0314088 A1* | 11/2013 | Wiggins ........... G01R 33/34092 324/322 |
| 2014/0347154 A1 | 11/2014 | Schmelzer |
| 2018/0006352 A1* | 1/2018 | Issakov .................... H01F 27/28 |

* cited by examiner

*Primary Examiner* — Gregory H Curran

(57) ABSTRACT

A radio-frequency power converter and a radio-frequency transmission system for magnetic resonance imaging are provided in embodiments of the present invention. The radio-frequency power converter comprises a printed circuit board, the printed circuit board comprises a first circuit layer, a ground layer, and one or a plurality of intermediate layers located between the first circuit layer and the ground layer. A plurality of planar spiral inductors connected in parallel are formed on the first circuit layer. One ends of the plurality of inductors are connected to each other and respectively connected to one end of a first capacitor, the other ends of the plurality of inductors are respectively connected to one ends of a plurality of second capacitors, and the other ends of the plurality of second capacitors are all grounded.

15 Claims, 12 Drawing Sheets

RADIO-FREQUENCY POWER CONVERTER AND RADIO-FREQUENCY TRANSMISSION SYSTEM FOR MAGNETIC RESONANCE IMAGING

CROSS-REFERENCE TO RELATED APPLICATIONS

This application claims the benefit of Chinese Patent Application No. 201910814431.4 filed on Aug. 30, 2019, the disclosure of which is herein incorporated by reference in its entirety.

TECHNICAL FIELD

Embodiments disclosed in the present invention relate to the medical imaging technologies, and more particularly, to a radio-frequency power converter and radio-frequency transmission system for magnetic resonance imaging.

BACKGROUND

MRI systems have been widely used in the field of medical diagnosis. An MRI system mainly includes a main magnet, a gradient amplifier, a gradient coil assembly, a radio-frequency transmission chain module, a radio-frequency coil assembly, a radio-frequency reception chain module, and the like. A radio-frequency transmission chain module usually includes a radio-frequency generator and a radio-frequency amplifier. A radio-frequency generator is configured to generate a radio-frequency power signal. A radio-frequency amplifier is configured to amplify the radio-frequency power signal generated by the radio-frequency generator. An amplified radio-frequency power signal is processed and then transmitted to the radio-frequency coil assembly. A radio-frequency coil assembly may include the body coil shown in FIG. 104, or a local transmission coil, which responds to the aforementioned amplified radio-frequency power signal to transmit a radio-frequency excitation pulse to an object to be scanned (e.g., a patient).

Due to limitations incurred from characteristics and performances of the amplifier device, the power required to excite the radio-frequency transmission coil generally cannot be attained simply by using the amplifier. Therefore, a radio-frequency power distributor is usually used to provide radio-frequency input signals required by a plurality of amplifier units. At an output part, a radio-frequency power synthesizer may also be used to synthesize radio-frequency output signals of various amplifier units and provide the synthesized signal to the radio-frequency transmission coil and a front-end circuit thereof.

Generally, in high-frequency radio-frequency applications such as in the communications field, a traditional WilkinSon-type power distributor or synthesizer is used. It includes a plurality of transmission lines, such as coaxial transmission lines, microstrip lines, or strip lines. The length of each transmission line is about a quarter of its wavelength. This requires a very long transmission line for lower frequency applications such magnetic resonance imaging. Such a configuration poses a major hindrance to space saving and miniaturization.

In order to overcome the aforementioned size-related limitations, the prior art has also proposed to adopt a Lumped Wilkinson power distributor or synthesizer, which uses lumped capacitive and inductive elements to form an equivalent circuit of the traditional Wilkinson. The Lumped Wilkinson power distributor or synthesizer in magnetic resonance imaging needs to have specific values of capacitors and inductors, but standard lumped capacitors or inductors currently available in the market usually cannot be applied in magnetic resonance imaging. In the production process of a magnetic resonance imaging device, the process even requires manual manufacturing of each inductor. This not only requires addition procurement of additional materials, but also increases labor and time costs. Manual manufacturing may further incur problems relating to inconsistent performance parameters, thus requiring extra resources for debugging.

The prior art has also proposed to sheath a short transmission line with a magnetic core, which can serve as an equivalent to the long transmission line of a traditional Wilkinson device. While this method can achieve a compact and small device structure, the transmission efficiency is greatly compromised due to the severe overheating problem caused by magnetic core loss.

Therefore, there is a need in the art for a new radio-frequency power converter for magnetic resonance imaging that can solve at least one of the above problems.

SUMMARY OF THE INVENTION

A radio-frequency power converter for magnetic resonance imaging is provided in an embodiment of the present invention. The radio-frequency power converter comprises a printed circuit board, wherein the printed circuit board comprises a first circuit layer, a ground layer, and one or a plurality of intermediate layers located between the first circuit layer and the ground layer. A plurality of planar spiral inductors connected in parallel are formed on the first circuit layer. One ends of the plurality of inductors are connected to each other and respectively connected to one end of a first capacitor; the other ends of the plurality of inductors are respectively connected to one ends of a plurality of second capacitors. The other ends of the plurality of second capacitors are all grounded.

Optionally, the first circuit layer is a top circuit board of the printed circuit board.

Optionally, the first capacitor and the plurality of second capacitors are provided on one of the one or a plurality of intermediate layers.

Optionally, the intermediate layer where the first capacitor and the plurality of second capacitors are located and the ground layer are adjacent circuit layers.

Optionally, the first capacitor and the plurality of second capacitors are chip capacitors formed on the intermediate layer, respectively.

Optionally, the first capacitor and the second capacitor are formed into a sector structure having an angle of sector between 110 degrees and 140 degrees.

Optionally, the plurality of inductors are connected to the first capacitor or to the plurality of second capacitors respectively through first through holes provided on the printed circuit board, and the first capacitor and the plurality of capacitors are connected to the ground layer respectively through second through holes provided on the printed circuit board.

Optionally, the first capacitor and the plurality of second capacitors are standard capacitors soldered on the first circuit layer respectively.

Optionally, each planar spiral inductor has a square shape as a whole, and the side length of the square shape is less than 5 cm.

Optionally, the radio-frequency power converter is a radio-frequency power distributor, wherein one ends of the plurality of inductors connected to the first capacitor are used for receiving a power signal to be distributed, and one ends of the plurality of inductors respectively connected to the plurality of second capacitors are used for outputting a plurality of power distribution signals obtained by distributing the received power signal to be distributed.

Optionally, the radio-frequency power converter is a radio-frequency power synthesizer, wherein one ends of the plurality of inductors respectively connected to the plurality of second capacitors are used for respectively receiving power signals to be synthesized, and one ends of the plurality of inductors connected to the first capacitor are used for outputting a power synthesis signal obtained by synthesizing the plurality of power signals to be synthesized.

A radio-frequency transmission system for magnetic resonance imaging is further provided in another embodiment of the present invention, comprising:

a radio-frequency generator configured to output a radio-frequency power signal;

a driving amplifier configured to perform primary amplification on the radio-frequency power signal;

the above radio-frequency power distributor, wherein one ends of the plurality of inductors connected to the first capacitor are used for receiving the primarily amplified radio-frequency power signal from the driving amplifier, and one ends of the plurality of inductors respectively connected to the plurality of second capacitors are used for outputting a plurality of power distribution signals obtained by distributing the primarily amplified radio-frequency power signal;

a plurality of final amplifiers respectively configured to amplify the plurality of power distribution signals; and the above radio-frequency power synthesizer, wherein one ends of the plurality of inductors respectively connected to the plurality of second capacitors are used for receiving the power distribution signals amplified by the plurality of final amplifiers respectively, and one ends of the plurality of inductors connected to the first capacitor are used for outputting a power synthesis signal, the power synthesis signal being a power synthesis signal obtained by synthesizing the plurality of amplified power distribution signals.

Optionally, a secondary radio-frequency power synthesizer is further comprised, which comprises the radio-frequency power synthesizer according to claim 11, wherein one ends of a plurality of inductors in the secondary radio-frequency power synthesizer respectively connected to the plurality of second capacitors are used for receiving a plurality of power synthesis signals output by a plurality of the radio-frequency power synthesizers respectively, and one ends of the plurality of inductors in the secondary radio-frequency power synthesizer connected to the first capacitor are used for outputting a secondary power synthesis signal, the secondary power signal being a secondary power synthesis signal obtained by synthesizing the plurality of power synthesis signals.

Optionally, an output impedance of the radio-frequency power distributor is equal to an input impedance of the corresponding final amplifier, and an input impedance of the radio-frequency power synthesizer is equal to an output impedance of each final amplifier.

Optionally, the output impedance of the radio-frequency power distributor and the input impedance of the radio-frequency power synthesizer are both less than 10 ohms.

Optionally, each planar spiral inductor in the radio-frequency power distributor and the radio-frequency power synthesizer has a square shape as a whole, and the side length of the square shape is less than 4 cm.

BRIEF DESCRIPTION OF THE DRAWINGS

The present invention will be better understood through the following description of non-limiting embodiments with reference to the accompanying drawings, where.

DETAILED DESCRIPTION

Specific implementation manners of the present invention will be described in the following. It should be noted that during the specific description of the implementation manners, it is impossible to describe all features of the actual implementation manners in detail in this description for the sake of brief description. It should be understood that in the actual implementation of any of the implementation manners, as in the process of any engineering project or design project, a variety of specific decisions are often made in order to achieve the developer's specific objectives and meet system-related or business-related restrictions, which will vary from one implementation manner to another. Moreover, it can also be understood that although the efforts made in such development process may be complex and lengthy, for those of ordinary skill in the art related to content disclosed in the present invention, some changes in design, manufacturing, production or the like based on the technical content disclosed in the present disclosure are only conventional technical means, and should not be construed as that the content of the present disclosure is insufficient.

Unless otherwise defined, the technical or scientific terms used in the claims and the description are as they are usually understood by those of ordinary skill in the art to which the present invention pertains. The words "first," "second" and similar words used in the description and claims of the patent application of the present invention do not denote any order, quantity or importance, but are merely intended to distinguish between different constituents. "One," "a(n)" and similar words are not meant to be limiting, but rather denote the presence of at least one. The word "include," "comprise" or a similar word is intended to mean that an element or article that appears before "include" or "comprise" encompasses an element or article and equivalent elements that are listed after "include" or "comprise," and does not exclude other elements or articles. The word "connect," "connected" or a similar word is not limited to a physical or mechanical connection, and is not limited to a direct or indirect connection.

First Embodiment

Figure 1:
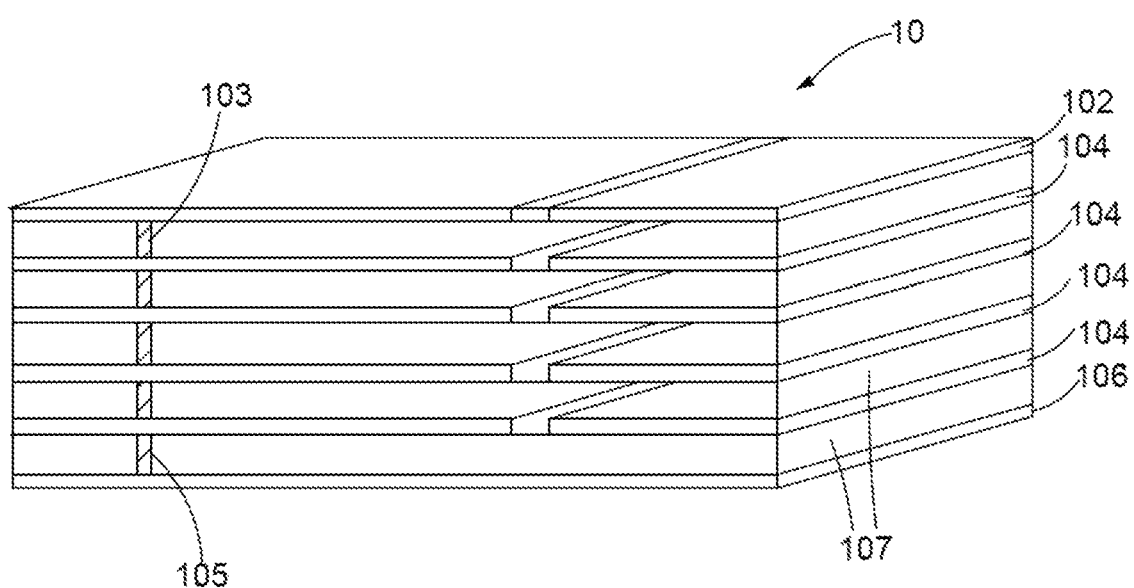
FIG. 1 is a cross-sectional diagram of a radio-frequency power converter according to a first embodiment of the invention.

A radio-frequency power converter for magnetic resonance imaging is provided in the first embodiment of the present invention. The above radio-frequency power converter may be configured to distribute or synthesize radio-frequency power. FIG. 1 is a cross-sectional diagram of a radio-frequency power converter according to the first embodiment of the present invention. As shown in FIG. 1, the radio-frequency power converter includes a printed circuit board 10, and the printed circuit board 10 includes a first circuit layer 102, a ground Layer 106, a plurality of intermediate layers 104 located between the first circuit layer 102 and the ground layer 106.

The first circuit layer 102, the intermediate layers 104, and the ground layer 106 are all circuit layers. As an embodiment, the printed circuit board 10 may include 6 circuit layers, and there are 4 intermediate layers 104 between the first circuit layer 102 and the ground layer 106. A dielectric layer 107 is provided between adjacent circuit layers. The dielectric layer 107 may be made of a plate material such as epoxy resin and Teflon, and preferably a RogerS plate material. In other embodiments, the number of the circuit layers or the thickness of the dielectric layer 107 may be increased or decreased based on the required device size, performance parameters, and the like. Each of the above circuit layers may be a conductive metal layer provided on the dielectric layer by, for example, a deposition method, and the material of the conductive metal layer may be copper. An electronic circuit, such as a capacitor and an inductor that will be described below, may be formed on the conductive metal layer by, for example, an etching method.

Figure 2:
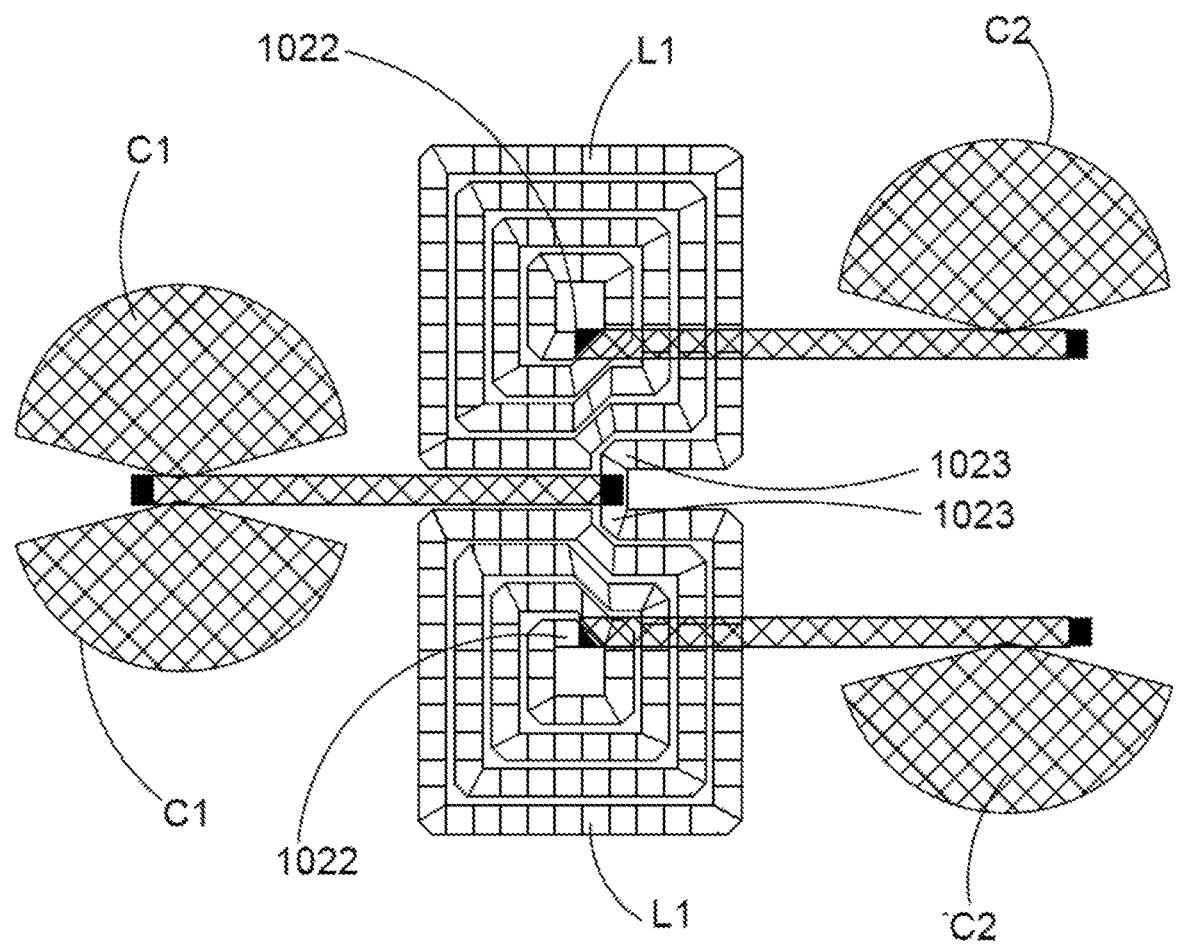
FIG. 2 is a schematic structural diagram of a radio-frequency power converter according to the first embodiment of the present invention.

FIG. 2 is a schematic structural diagram of a radio-frequency power converter according to the first embodiment of the present invention. As shown in FIG. 2, a plurality of planar spiral inductors L1 connected in parallel are formed on the first circuit layer 102. The quantity of the inductors L1 may be determined based on the number of shunts of a required power distributor or synthesizer. Although FIG. 2 shows an example of forming two power converters by two inductors connected in parallel, it should be understood that more inductors connected in parallel can be formed on the printed circuit board 10.

In one example, the first circuit layer 102 is a top circuit board of the printed circuit board 10, and the above planar spiral inductor L1 is formed on the top circuit board so that there is an enough distance between the planar spiral inductor L1 and the ground layer 106. Therefore, the size of the planar spiral inductor L1 can be sufficiently small while obtaining a required inductance, so that the power converter has a sufficiently compact structure.

In one embodiment, the planar spiral inductor L1 is formed by forming a spirally distributed planar metal strip with a certain width on the first circuit layer 102. Each planar spiral inductor L1 has a square shape as a whole, and the side length of the square shape may be less than 5 cm (for example, 3 cm to 5 cm). The planar spiral inductors L1 each have an end 1022 located in the interior thereof and an end 1023 located at the exterior thereof. The two ends 1022 and 1023 of the planar spiral inductor L1 are used for electrically connecting to other circuit elements, respectively, which will be described in detail below.

In this embodiment, a first capacitor C1 and a plurality of second capacitors C2 are formed on at least one of the plurality of intermediate layers 104. Specifically, each first capacitor X1 and each second capacitor C2 are respectively a chip capacitor formed on the intermediate layer 104, and specifically may be a conductive metal sheet formed on the intermediate layer 14.

Further, the intermediate layer 104 where the first capacitor C1 and the plurality of second capacitors C2 are located is used as a second circuit layer, and may be a circuit layer adjacent to the ground layer 106. In this way, the first capacitor and the second capacitors C2 have a suitable distance from the ground layer 106, so that the size of the capacitor can be made sufficiently small while obtaining a suitable capacitance. A power converter with a more compact structure can thus be obtained.

The above first capacitor C1 may include a plurality of capacitors each having a relatively small capacitance, or may include a capacitor having a relatively large capacitance. This can be determined based on wiring, size, performance and other requirements. For example, the power converter shown in FIG. 2 includes two first capacitors C1. The two first capacitors C1 are symmetrically arranged to facilitate wiring and ensure the working efficiency of the power converter. In other embodiments, only one first capacitor with a larger size may also be designed to replace the two first capacitors C1.

Each first capacitor C1 and each second capacitor C2 are of a sector structure formed on an intermediate layer 104 respectively. The center position of the sector shape is used as a connection node of the capacitor, which can avoid more power loss caused by the excessive node range. As an example, the angle of the sector structure may be between 110 degrees and 140 degrees, and the radius may be between 15 mm and 25 mm.

One ends 1023 of the plurality of inductors L1 are connected to each other and respectively connected to one end of the first capacitor C1, the other ends 1022 of the plurality of inductors L1 are respectively connected to one ends of the plurality of second capacitors C2, and the other ends of the plurality of second capacitors C2 are all grounded.

A first through hole (e.g., a through hole 103 in FIG. 1) may be provided between the first circuit layer 102 and the intermediate layer (e.g., the second circuit layer) 104 where the first capacitor C1 and the second capacitors C2 are formed. A second through hole (e.g., a through hole 105 in FIG. 1) may be provided between the intermediate layer 104 where the first capacitor C1 and the second capacitors C2 are formed and the ground layer 106. The above through holes are used for achieving signal communication between different circuit layers. For example, after the ends 1022 of the two inductors L1 shown in FIG. 2 are connected to each other, they are also connected to the first capacitor C1 through one first through hole. The end 1023 of each inductor L1 is connected to the corresponding second capacitor C2 through one first through hole. Each first capacitor C1 and second capacitor C2 may be connected to the ground layer 106 through corresponding second through holes.

Figure 3:
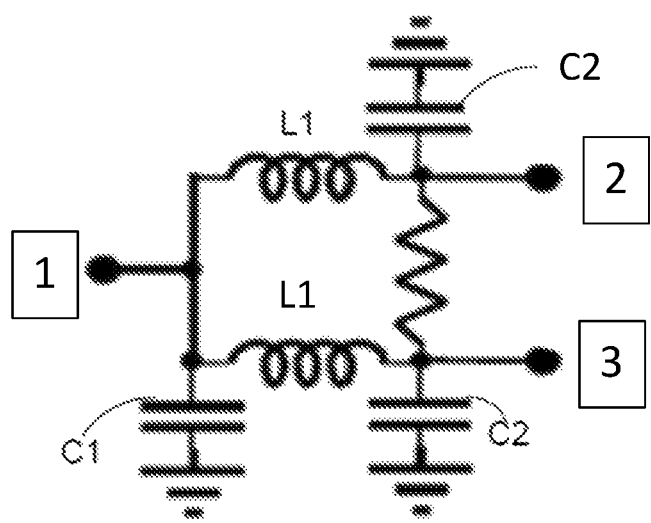
FIG. 3 shows an equivalent circuit of the radio-frequency power converter shown in FIG. 2.

FIG. 3 shows an equivalent circuit of the radio-frequency power converter shown in FIG. 2. According to the above description, in this embodiment, a planar spiral inductor and a chip capacitor are designed on the printed circuit board, and they are electrically connected to form a radio-frequency power converter having a circuit structure shown in FIG. 3. It not only overcomes the problem of the difficulty in configuring standard inductive and capacitive components in the prior art, but also overcomes the challenge of size design brought by the use of a transmission line converter, realizes a compact device structure, and further avoids the problem of low efficiency due to the use of a magnetic core type transmission line converter.

As shown in FIG. 3, when the radio-frequency power converter is used as a power distributor, one ends (i.e., port 1) of the two inductors L1 connected to the first capacitor C1 are used as input ends for receiving a power signal to be distributed. One ends (i.e., ports 2 and 3) of the two inductors L1 connected to two second capacitors C2 are used for outputting a plurality of power distribution signals obtained by distributing the power signal to be distributed.

When the radio-frequency power converter is used as a power synthesizer, the ports 2 and 3 are used as input ends for respectively receiving power signals to be synthesized, and the port 1 is used as an output end for outputting a power synthesis signal obtained by synthesizing the plurality of power signals to be synthesized.

In the present embodiment, the planar spiral inductor and the standard capacitive element are formed on the printed circuit board, and they are electrically connected to form the radio-frequency power converter having the circuit structure shown in FIG. 3.

FIG. 4 to FIG. 7 show performance test curves of a radio-frequency power synthesizer with two signals according to the first embodiment. In the curve shown in FIG. 4, the horizontal axis represents the frequency and the vertical axis represents gains of the two signals. As can be seen from FIG. 4, at the center frequency (about 64 MHz) of magnetic resonance imaging, the gains of the two signals of the radio-frequency power synthesizer are both 3.100 dB, and there is only a gain loss of 0.067 compared with an ideal gain (3.033 dB). Moreover, the two curves of the gain loss of the output end with respect to the two input ends coincide, indicating that the two signals have a good consistency, that is, a good equal-amplitude in-phase characteristic.

Figure 5:
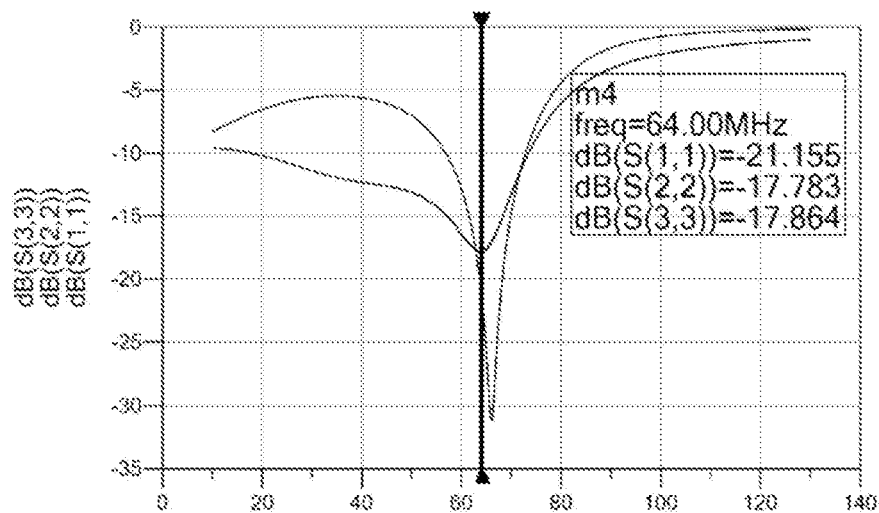

FIG. 5 shows return losses (signal reflections) of an output end (1, 1) and two input ends (2, 2) and (3, 3) of the radio-frequency power synthesizer. As can be seen from FIG. 5, the above return losses of the three ports are small enough.

Figure 6:
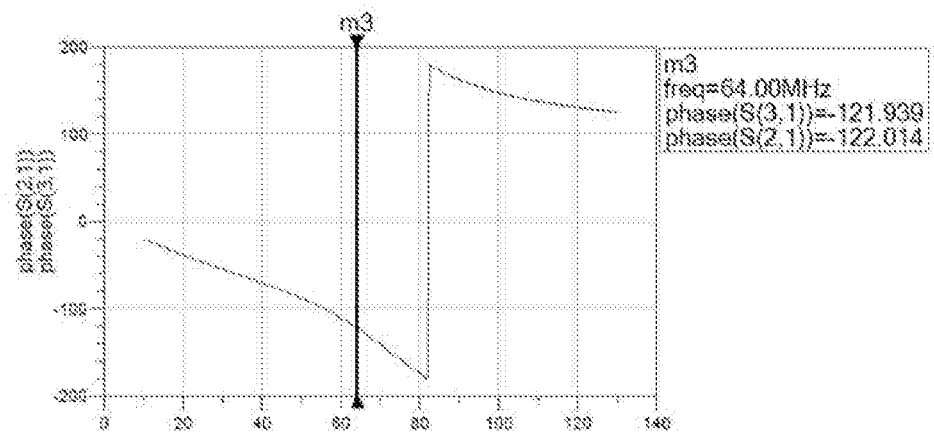

FIG. 6 shows a phase curve of the radio-frequency power synthesizer, in which the horizontal axis represents the frequency and the vertical axis represents the phase. As can be seen from FIG. 6, phase curves respectively corresponding to the two signals coincide, indicating that the radio-frequency power synthesizer has a good phase consistency.

Figure 7:
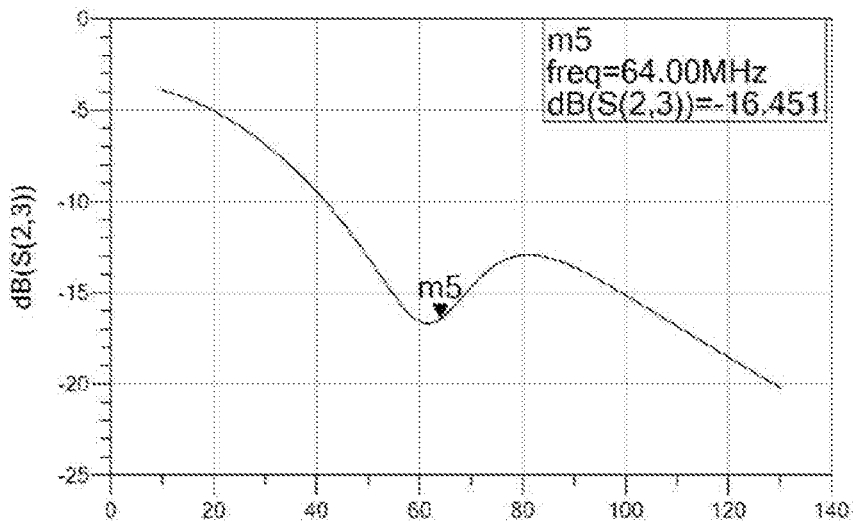

FIG. 7 shows the isolation performance of the two signals of the radio-frequency power synthesizer, in which the horizontal axis represents the frequency and the vertical axis represents the interference characteristics of the two signals. As can be seen from FIG. 7, interference signals of the two signals are small, and therefore, the radio-frequency power synthesizer has a good electrical isolation characteristic.

Second Embodiment

A radio-frequency power converter for magnetic resonance imaging provided by the second embodiment of the present invention is similar to the first embodiment and includes a printed circuit board 10, the printed circuit board 10 includes a first circuit layer 102, a ground layer 106, and a plurality of intermediate layers 104 located between the first circuit layer 102 and the ground layer 106.

The first circuit layer 102, the plurality of intermediate layers 104, and the ground layer 106 are all circuit layers, and a dielectric layer is provided between adjacent circuit layers. The dielectric layer may be made of a plate material such as epoxy resin, Teflon, and RogerS. In other embodiments, the number of the circuit layers or the thickness of the dielectric layer may be increased or decreased based on the required device size, performance parameters, and on the like. Each of the above circuit layers may be a conductive metal layer provided on the dielectric layer by, for example, a deposition method, and the material of the conductive metal layer may be copper. For example, an inductive element may be formed on the conductive metal layer by, for example, an etching method.

Figure 4:
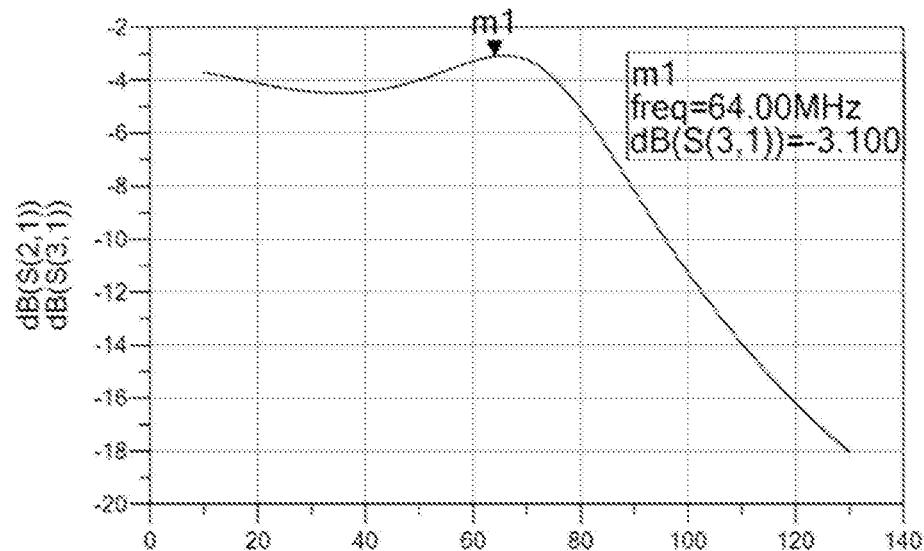
FIG. 4 to FIG. 7 show performance test curves of a radio-frequency power synthesizer with two signals according to the first embodiment.
Figure 8:
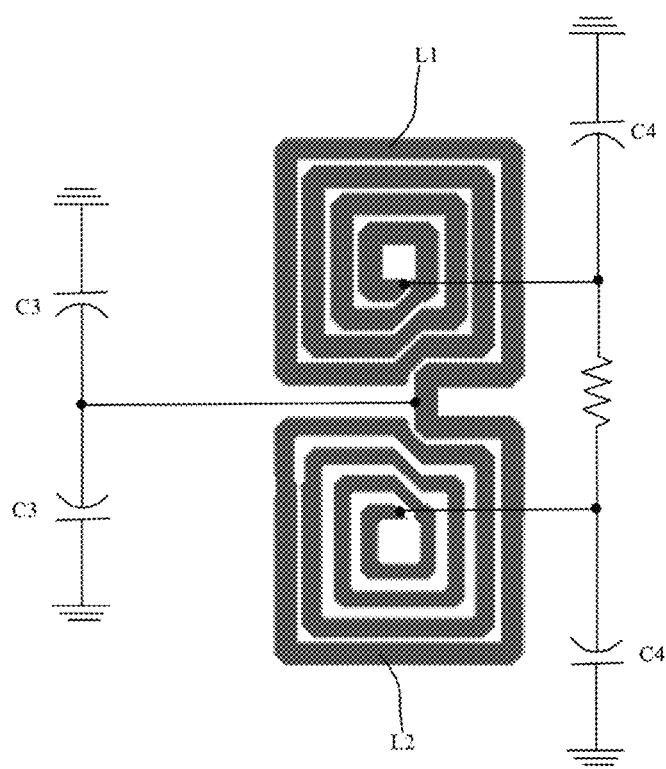
FIG. 8 is a schematic structural diagram of a radio-frequency power converter according to a second embodiment of the present invention.
Figure 9:
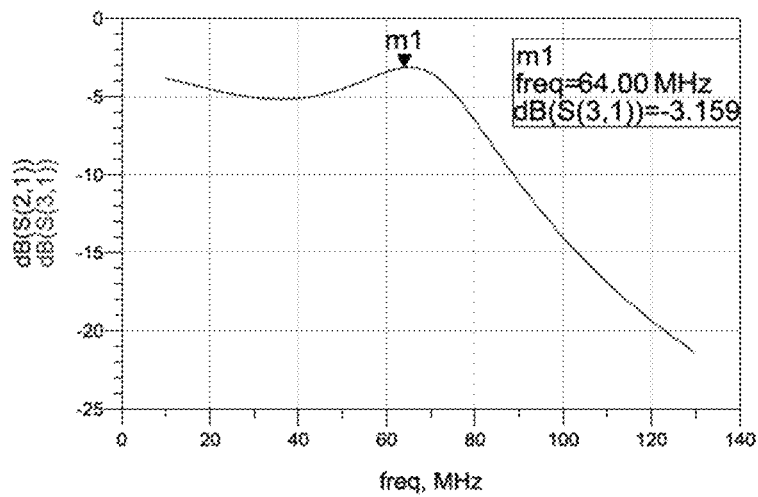
FIG. 9 to FIG. 12 show performance test curves of a radio-frequency power synthesizer with two signals according to the second embodiment.

FIG. 8 is a schematic structural diagram of a radio-frequency power converter according to the second embodiment of the present invention. As shown in FIG. 8, a plurality of planar spiral inductors L1 connected in parallel are formed on the first circuit layer 102. The quantity of the inductors L1 may be determined based on the number of shunts of a required power distributor or synthesizer. Although FIG. 4 shows an example of forming two power converters by two inductors connected in parallel, it should be understood that more inductors connected in parallel can be formed on the printed circuit board.

In one example, the printed circuit board 10 may include 6 circuit layers, and there are 4 intermediate layers 104 between the first circuit layer 102 and the ground layer 106. The first circuit layer 102 is a top circuit board of the printed circuit board 10, the above planar spiral inductor L1 is formed on the top circuit board, and a plurality of intermediate layers are provided between the top circuit board and the ground layer, so that there is an enough distance between the planar spiral inductor L1 and the ground layer 106. Therefore, the size of the planar spiral inductor L1 can be sufficiently small while obtaining a required inductance, so that the power converter has a sufficiently compact structure.

In one embodiment, the planar spiral inductor L1 is formed by forming a spirally distributed planar metal strip with a certain width on the first circuit layer 102. Each planar spiral inductor L1 has a square shape as a whole, and the side length of the square shape is 3 cm to 5 cm. The planar spiral inductors L1 each have an end 1022 located in the interior thereof and an end 1023 located at the exterior thereof. The two ends 1022 and 1023 of the planar spiral inductor L1 are used for electrically connecting to other circuit elements, respectively, which will be described in detail below.

In this embodiment, a first capacitor 1026 and a plurality of second capacitors C4 are further soldered on the first circuit layer 102. Specifically, each first capacitor C3 and each second capacitor C4 are respectively a standard capacitive element soldered on the first circuit layer 102. The above standard capacitive element may be a capacitive element processed and manufactured according to a nation- or institution-specified standard, which has a stable capacitance value, and the capacitance value can meet a requirement of a power converter in magnetic resonance imaging.

The above first capacitor C3 may include a plurality of capacitors each having a relatively small capacitance, or may include a capacitor having a relatively large capacitance. This can be determined based on wiring, size, performance and other requirements. For example, the power converter shown in FIG. 4 includes one first capacitor C3. In other embodiments, a plurality of standard capacitive elements each having a relatively small capacitance connected in parallel may be provided to replace the first capacitor C3.

One ends of the plurality of inductors (planar spiral inductors) L1 are connected to each other and respectively connected to one end of the first capacitor C3, the other ends of the plurality of inductors L1 are respectively connected to one ends of the plurality of second capacitors C4, and the other ends of the plurality of second capacitors C4 are all grounded.

A through hole may be provided between the first circuit layer 102 and the ground layer 106. The above through hole is configured to connect the capacitive elements (e.g., the first capacitor and the second capacitor) on the first circuit layer 102 to the ground layer 106. On the first circuit layer 102, the connection between the inductor and the standard capacitive element may be an electrical connection implemented by leads and pads formed on the first circuit layer 102.

The equivalent circuit of the radio-frequency power converter according to the second embodiment of the present invention is the same as the circuit shown in FIG. 3. According to the above description, in this embodiment, the planar spiral inductor and the standard capacitive element are formed on the printed circuit board, and they are electrically connected to form the radio-frequency power converter having the circuit structure shown in FIG. 3. It not only overcomes the problem of the difficulty in configuring standard inductive components in the prior art, but also overcomes the challenge of size design brought by the use of a transmission line converter, realizes a compact device structure, and further avoids the problem of low efficiency due to the use of a magnetic core transmission line converter. Furthermore, by combining the planar inductive element and the standard capacitive element, a balance between the performance stability and the processing difficulty is achieved.

FIG. 9 to FIG. 12 show performance test curves of a radio-frequency power synthesizer with two signals according to the second embodiment. In the curve shown in FIG. 9, the horizontal axis represents the frequency and the vertical axis represents gains of the two signals. As can be seen from FIG. 9, at the center frequency (about 64 MHz) of magnetic resonance imaging, the gains of the two signals of the radio-frequency power synthesizer are both 3.159 dB, which is very close to the ideal gain (3.033 dB), so it has a small gain loss. In addition, the two curves of the gain loss of the output end with respect to the two input ends coincide, indicating that the two signals have a good consistency, i.e., a good equal-amplitude in-phase characteristic.

Figure 10:
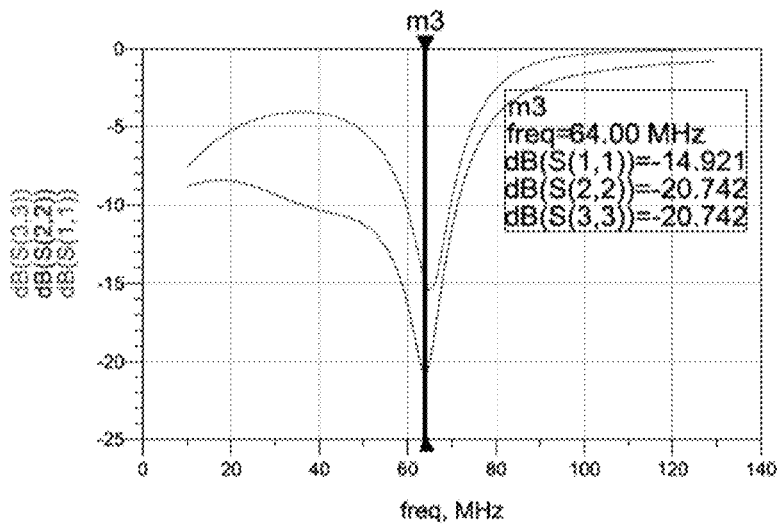

FIG. 10 shows return losses (signal reflections) of an output end (1, 1) and two input ends (2, 2) and (3, 3) of the radio-frequency power synthesizer. As can be seen from FIG. 10, the above return losses of the three ports are small enough.

Figure 11:
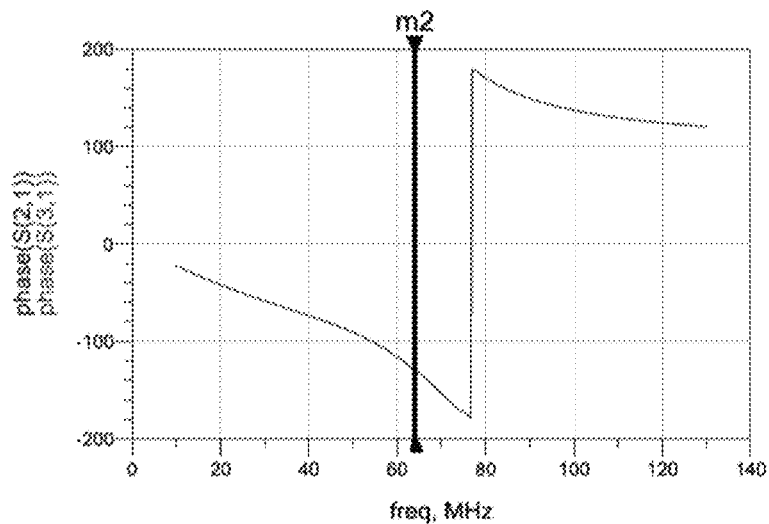

FIG. 11 shows a phase curve of the radio-frequency power synthesizer, in which the horizontal axis represents the frequency and the vertical axis represents the phase. As can be seen from FIG. 11, phase curves respectively corresponding to the two signals coincide, indicating that the radio-frequency power synthesizer has a good phase consistency.

Figure 12:
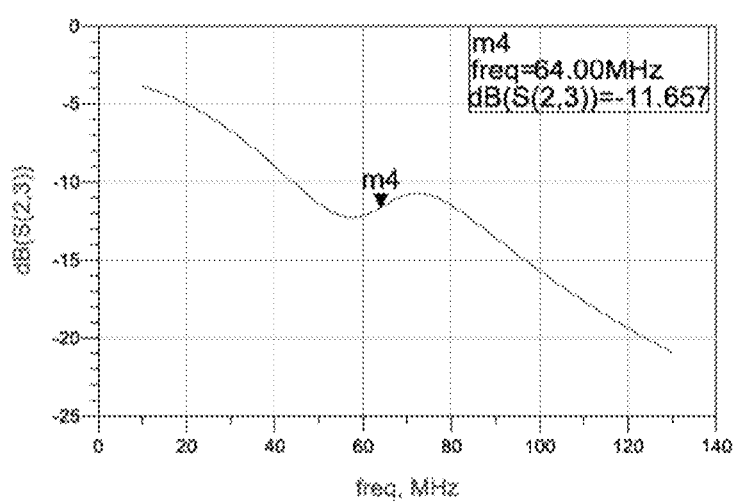

FIG. 12 shows the isolation performance of the two signals of the radio-frequency power synthesizer, in which the horizontal axis represents the frequency and the vertical axis represents the interference characteristics of the two signals. As can be seen from 12, interference signals of the two signals are small, and therefore, the radio-frequency power synthesizer has a good electrical isolation characteristic.

Third Embodiment

A radio-frequency power converter for a magnetic resonance imaging system provided by the third embodiment of the present invention is similar in structure and principle to the radio-frequency power converter of the first embodiment or the second embodiment. The difference is that in the third embodiment, when the radio-frequency power converter is a radio-frequency power distributor, an output impedance thereof is less than 50 ohms, and more specifically, less than 10 ohms; and when the radio-frequency power converter is a radio-frequency power synthesizer, an input impedance thereof is less than 50 ohms, and more specifically, less than 10 ohms.

In the field of traditional magnetic resonance imaging, when testing and debugging a radio-frequency transmission link, it is customary to design both input and output impedances of various devices (including the radio-frequency power synthesizer and/or the radio-frequency power distributor) in the link to 50 ohms, thus facilitating testing the various devices separately. Taking the radio-frequency power synthesizer as an example, since the output impedance of a generally designed radio-frequency power amplifier is small (e.g., less than 10 ohms or even less than 5 ohms), in order to match the impedance of the radio-frequency power synthesizer with that of the radio-frequency power amplifier connected to a front end thereof, a complex impedance matching network is required to convert the output impedance of the radio-frequency power amplifier to 50 ohms. Similarly, such a matching network is needed between the radio-frequency power amplifier and the radio-frequency power distributor.

In this embodiment, unlike the traditional radio-frequency power synthesizer or radio-frequency power distributor, the input impedance and the output impedance of the radio-frequency power converter are small enough to directly implement impedance matching with the radio-frequency power amplifier used for magnetic resonance imaging, without the need of providing an impedance matching network between the radio-frequency power amplifier and the radio-frequency power converter. Alternatively, the impedance matching can be achieved only by a very simple impedance matching unit (e.g., a short segment of transmission line). During the test, the radio-frequency power amplifier, as well as the radio-frequency power distributor and the radio-frequency power synthesizer connected to the radio-frequency power amplifier can be tested as a whole.

Figure 13:
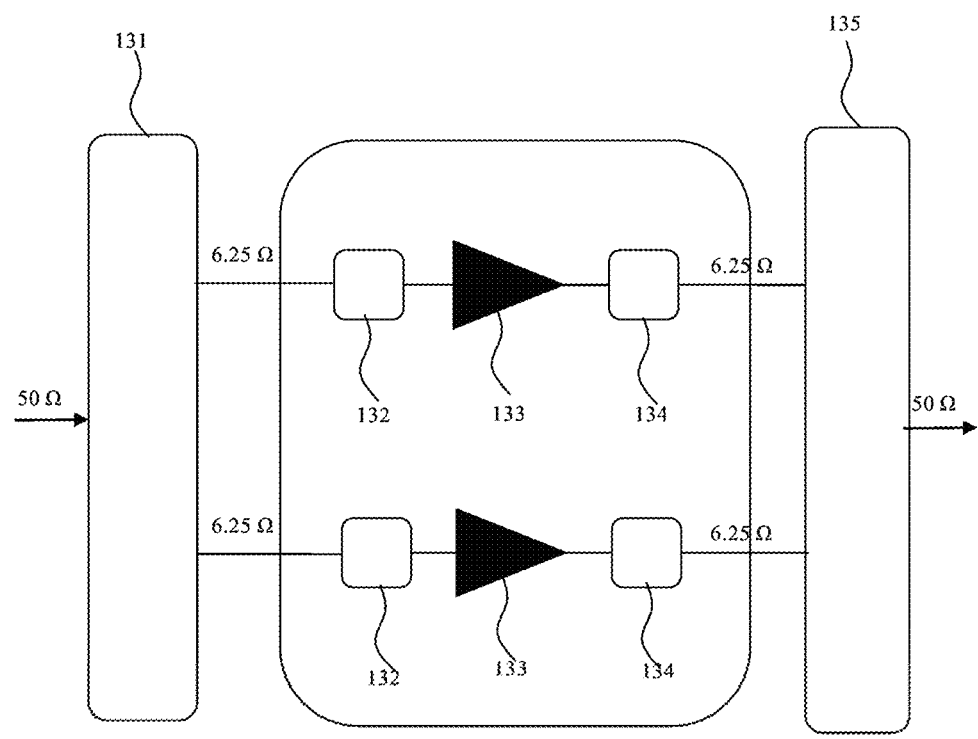
FIG. 13 is an exemplary block diagram of applying the radio-frequency power synthesizer and the radio-frequency power distributor according to a third embodiment of the present invention to a radio-frequency transmission link of magnetic resonance imaging.

FIG. 13 is an exemplary block diagram of applying the radio-frequency power synthesizer and the radio-frequency power distributor according to the third embodiment of the present invention to a radio-frequency transmission link of magnetic resonance imaging. As shown in FIG. 13, an input impedance of a radio-frequency power distributor 131 is still 50 ohms, and output impedances of two output ends are 6.25 ohms respectively. Impedance matching with an input end of a corresponding radio-frequency power amplifier 133 is achieved by an impedance matching unit 132 having a simple structure. An output end of each radio-frequency power amplifier 133 achieves an output impedance of 6.25 by an impedance matching unit 134 having a simple structure, and impedances of two input ends of a radio-frequency power synthesizer 135 are also 6.25 ohms, which match the output impedance of the corresponding impedance matching unit 134. An impedance of the input end of the radio-frequency power distributor 131 and an impedance of the output end of the radio-frequency power synthesizer 135 are both 50 ohms. In this way, it facilitates testing the radio-frequency power distributor 131, the impedance matching unit 132, the radio-frequency power amplifier 133, the impedance matching unit 134, and the radio-frequency power synthesizer 135 as an integrated functional module.

In the above manner, the above impedance matching units 132 and 134 having simple structures can be used to replace the complex network matching unit. Alternatively, when the output impedance is made more accurate by using the radio-frequency power distributor or radio-frequency power synthesizer, or the output impedance is made more accurate by designing the radio-frequency power synthesizer, the impedance matching units 132 and 134 may be omitted. In this case, the output impedance of the radio-frequency power distributor or the input impedance of the radio-frequency power synthesizer can be directly equal to the optimal matching impedance (for example, generally less than 10 ohms) of the radio-frequency power amplifier 133. For example, the output impedance of the radio-frequency power distributor 131 is equal to an input impedance of a corresponding final amplifier 133, and the input impedance of the radio-frequency power synthesizer 135 is equal to an output impedance of each final amplifier 133. Therefore, the radio-frequency power converter according to the third embodiment of the present invention can make the module structure of the transmission link more compact.

Moreover, by changing the input impedance and output impedance, the size of the radio-frequency power converter itself can be further reduced. For example, when the structure shown in FIG. 13 is adopted, the size of the planar spiral inductors in the radio-frequency power distributor and the radio-frequency power synthesizer can be further reduced as compared with the first embodiment and the second embodiment. For example, the side length of the inductor can be reduced to less than 4 cm (for example, 2 cm to 4 cm).

Fourth Embodiment

Figure 14:
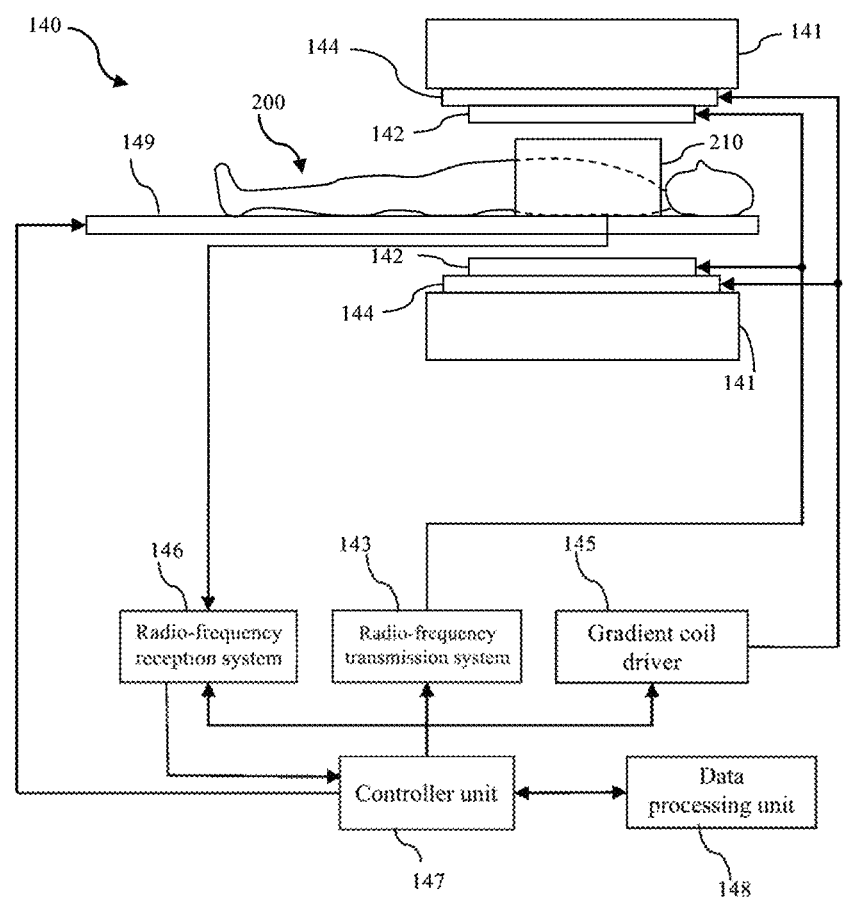
FIG. 14 exemplarily shows a magnetic resonance imaging system.

A radio-frequency transmission system for magnetic resonance imaging is provided in the fourth embodiment of the present invention. FIG. 14 exemplarily shows a magnetic resonance imaging system. As shown in FIG. 14, the magnetic resonance imaging (MRI) system 140 includes a main magnet assembly, a radio-frequency transmission coil 142, a radio-frequency transmission system 143, a gradient coil assembly 144, a gradient coil driver 145, a radio-frequency reception system 146, a controller unit 147, a data processing unit 148, and a scanning bed 149.

The main magnet assembly generally includes, for example, a superconducting magnet 141, and a main magnet coil is provided along the circumference of the superconducting magnet 1411. The superconducting magnet is mounted in an annular vacuum container, and defines a cylindrical imaging space surrounding a to-be-scanned object 200. A constant static magnetic field, such as a static magnetic field B0, is generated in the Z direction of the imaging space. The MRI system 140 uses the formed static magnetic field B0 to transmit a magnetostatic pulse signal to the to-be-scanned object 200 placed in the imaging space, so that the precession of protons in the to-be-scanned object is ordered, and a longitudinal magnetization vector is generated.

The radio-frequency transmission coil 142 is generally arranged along an inner ring of the main magnet, and is configured to, in response to a radio-frequency excitation pulse transmitted from the radio-frequency transmission system 143, transmit a radio-frequency field B1 orthogonal to the static magnetic field B0 to the to-be-scanned object 200, for exciting nucleus in the body of the to-be-scanned object 200, so that the longitudinal magnetization vector is changed to a transverse magnetization vector.

The radio-frequency transmission system 143 is configured to, in response to a pulse sequence control signal sent by the controller unit 147, transmit the radio-frequency excitation pulse to the radio-frequency transmission coil 142. Specifically, the controller unit 147 may generate a pulse sequence by, for example, a pulse sequence generator, and the radio-frequency transmission system 143 generates the radio-frequency excitation pulse according to radio-frequency pulses in the pulse sequence sent by the pulse sequence generator, and processes the radio-frequency excitation pulse. The radio-frequency excitation pulse is specifically a radio-frequency power signal. The radio-frequency transmission system 143 will be described in detail below with reference to FIG. 15.

After the radio-frequency excitation pulse ends, a free induction attenuation signal, that is, a magnetic resonance signal that can be collected, is generated in the process of the transverse magnetization vector of the to-be-scanned object 200 gradually returning to zero.

In one embodiment, the radio-frequency transmission system 143 transmits/receives a mode switching switch, which is configured to switch the radio-frequency transmission coil 142 between a transmission mode and a reception mode, in which in the reception mode. The radio-frequency transmission coil 142 may be configured to receive a magnetic resonance signal from the to-be-scanned object 200, and the magnetic resonance signal can also be collected by a radio-frequency reception coil 210 provided close to the to-be-scanned object 200.

The gradient coil assembly 144 generally includes three sets of gradient coils arranged along the X-axis, Y-axis, and Z-axis, which are respectively configured to receive power driving signals generated from the gradient coil driver 145 to generate a three-dimensional gradient magnetic field in the imaging space, so as to three-dimensionally encode the magnetic resonance signal, i.e., providing three-dimensional position information of the magnetic resonance signal.

Based on the three-dimensionally encoded magnetic resonance signal, a medical image of a scanning part of the to-be-scanned object can be reconstructed, which will be described below.

The radio-frequency reception system 146 is configured to receive the magnetic resonance signal collected by the radio-frequency reception coil 210 or by the radio-frequency transmission coil 142 in the reception mode. Specifically, the radio-frequency reception system 146 may include a radio-frequency preamplifier, a phase detector, an analog/digital converter, etc., in which the radio-frequency preamplifier is configured to amplify the magnetic resonance signal received by the radio-frequency reception coil or the radio-frequency transmission coil, the phase detector 1062 is configured to perform phase detection on the amplified magnetic resonance signal, and the analog/digital converter is configured to convert the phase-detected magnetic resonance signal from an analog signal to a digital signal and send it to the data processing unit 148.

The data processing unit 148 may perform pre-processing, reconstruction and other operations on the received digitized magnetic resonance signal to obtain the required image or image data. The data processing unit 148 may include a computer and a storage medium, and a program of predetermined data processing to be executed by the computer is recorded in the storage medium. The data signal processing unit 148 may be connected to the controller unit 147 and perform data processing based on a control signal received from the controller unit 147.

The controller unit 147 may include a computer and a storage medium, and the storage medium is configured to store a program that can be executed by the computer. When the program is executed by the computer, various components of the MRI system 140 may be caused to perform corresponding operations to perform imaging scanning on the to-be-scanned object 200.

Figure 15:
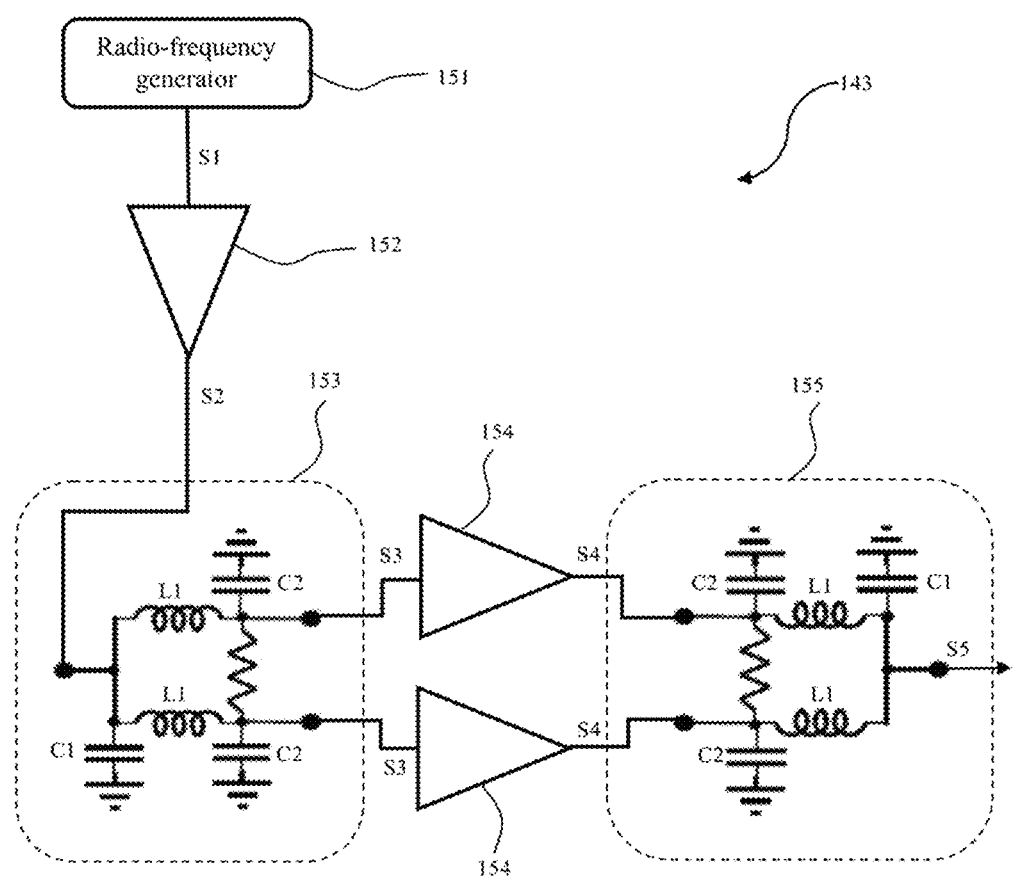
FIG. 15 is a block diagram of an implementation manner of a radio-frequency transmission system that can be used in the above magnetic resonance imaging system.

FIG. 15 is a block diagram of an implementation manner of the radio-frequency transmission system 143 that can be used in the above magnetic resonance imaging system 140. As shown in FIG. 15, the radio-frequency transmission system includes a radio-frequency generator 151, a driving amplifier 152, a radio-frequency power distributor 153, a final amplifier 154, and a primary radio-frequency power synthesizer 155. For ease of description and understanding, the radio-frequency power synthesizer 155 and the radio-frequency power distributor 154 in FIG. 15 are shown in the form of equivalent circuits. In practice, the radio-frequency power synthesizer 155 and the radio-frequency power distributor 154 may be examples of the first embodiment shown in FIG. 1 and FIG. 2, or the examples of the second embodiment shown in FIG. 8, or the examples of the third embodiment shown in FIG. 13.

The radio-frequency generator 151 is configured to output a radio-frequency power signal S1. The radio-frequency generator 151 may include a digital frequency synthesizer, a digital-to-analog converter, and the like. As mentioned above, the radio-frequency generator is configured to generate a radio-frequency pulse signal. In the scanning process of the MRI, the radio-frequency pulse signal is applied to the radio-frequency transmission coil 142 to excite a to-be-imaged part of the to-be-scanned object (e.g., a patient).

The driving amplifier 152 is configured to perform primary amplification on the radio-frequency power signal output by the radio-frequency generator 151.

The radio-frequency power distributor 153 may be the radio-frequency power converter in any of the first to third embodiments described above, in which one end of each inductor L1 in the radio-frequency power distributor connected to the first capacitor (C1 or C3) is used for receiving a primarily amplified radio-frequency power signal S2 from the driving amplifier 152, and one end of each inductor connected to the corresponding second capacitor (C2 or C4) is used for outputting a plurality of power distribution signals S3 obtained by distributing the signal S2.

Each power distribution signal S3 is amplified by a corresponding final amplifier 154.

The primary radio-frequency power synthesizer 155 is configured to perform power synthesis on power distribution signals S4 amplified by the various final amplifiers 154. The primary radio-frequency power synthesizer 155 may be the radio-frequency power converter in any of the first to third embodiments described above, in which one end of each inductor L1 in the primary radio-frequency power synthesizer 155 respectively connected to the corresponding second capacitor (C2 or C4) is used for receiving the power distribution signal S4 amplified by the corresponding final amplifier, and one ends of the plurality of inductors L1 connected to the first capacitor (C1 or C3) are used for outputting a power synthesis signal S5, the power synthesis signal being obtained by synthesizing the plurality of amplified power distribution signals S4.

Figure 16:
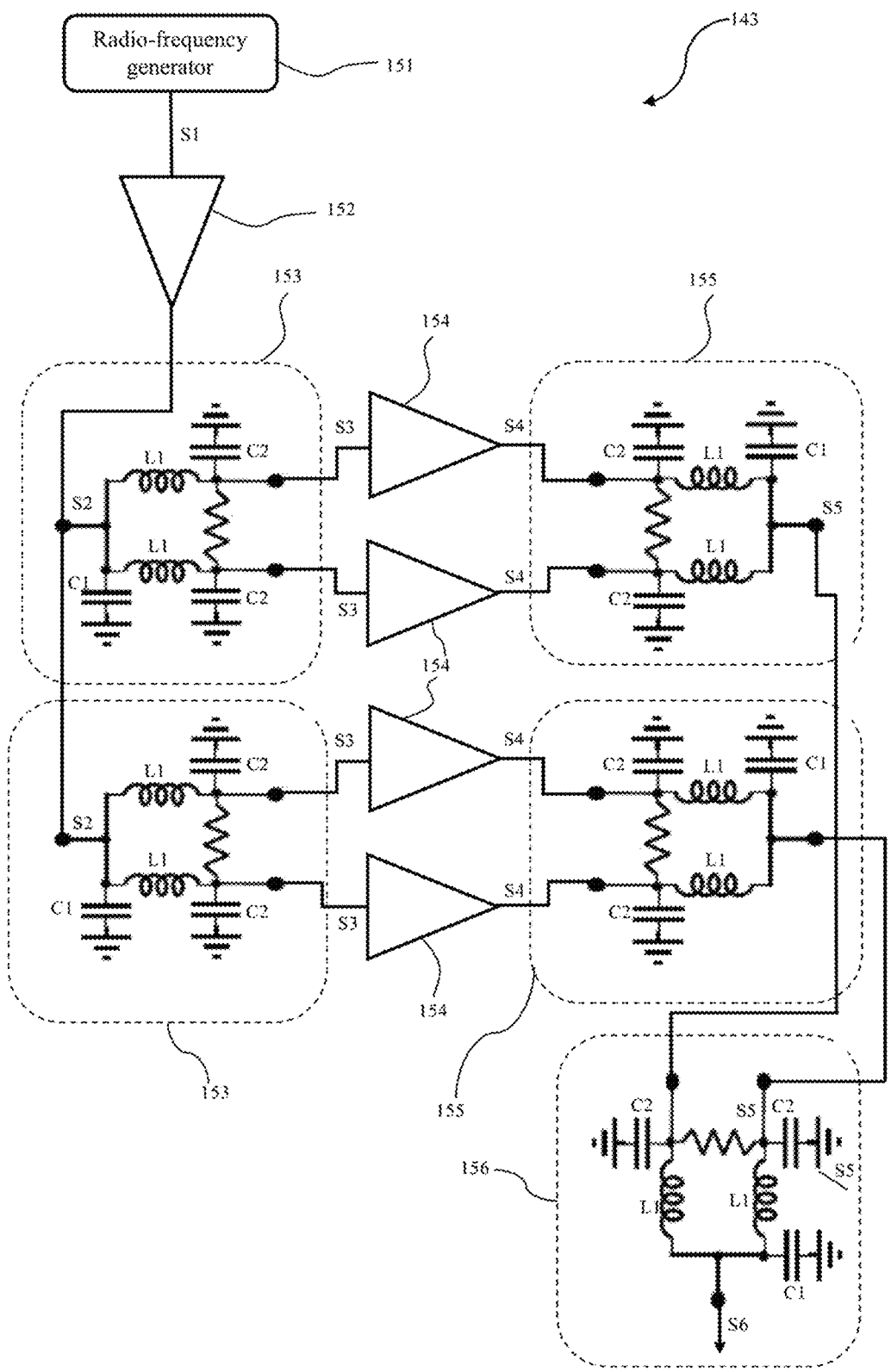
FIG. 16 is a block diagram of another implementation manner of a radio-frequency transmission system that can be used in the above magnetic resonance imaging system.

FIG. 16 is a block diagram of another implementation manner of the radio-frequency transmission system 143 that can be used in the above magnetic resonance imaging system 140. As shown in FIG. 16, the radio-frequency transmission system further includes a secondary radio-frequency power synthesizer 156. The secondary radio-frequency power synthesizer 156 may be the radio-frequency power converter in any of the first to third embodiments described above, in which one end of each inductor L1 respectively connected to the corresponding second capacitor (C2 or C4) is used for receiving a power synthesis signal S5 output by a primary radio-frequency power synthesizer, and one ends of the plurality of inductors L1 in the secondary radio-frequency power synthesizer connected to the first capacitor C1 or C3) are used for outputting a secondary power synthesis signal S6, the secondary power synthesis signal S6 being obtained by synthesizing the plurality of power synthesis signals S5.

In other implementation manners, the radio-frequency transmission system 143 may further include other modules or units, such as an I/Q two-way switch bridge, which is configured to divide a final power synthesis signal into two signals and transmit them to the radio-frequency transmission coil 142.

As used herein, an element or step described as singular and preceded by the word "a(n)" or "one" should be understood as not excluding such element or step being plural, unless such exclusion is explicitly stated. Furthermore, references to "one embodiment" of the present invention are not intended to be interpreted as excluding the existence of additional embodiments that also incorporate the recited features. Furthermore, unless explicitly stated to the contrary, an element or elements "comprising," "including," or "having" a specific property in the embodiment may include an additional such element that does not have that property. The terms "including" and "in which" are used as condensed language equivalents of the corresponding terms "comprising" and "wherein." Furthermore, in the appended claims, the terms "first," "second," "third" and so on are used merely as labels, and are not intended to impose numerical requirements or a particular positional order on their objects.

This written description uses examples to disclose the present invention, including the best mode, and also to enable those of ordinary skill in the relevant art to implement the present invention, including making and using any devices or systems and performing any incorporated methods. The patentable scope of the present invention is defined by the claims, and may include other examples that occur to those skilled in the art. Such other examples are intended to be within the scope of the claims if they have structural elements that do not differ from the literal language of the claims, or if they include equivalent structural elements without substantial differences from the literal language of the claims.

The invention claimed is:

1. A radio-frequency power converter for magnetic resonance imaging, comprising a printed circuit board, wherein the printed circuit board comprises a first circuit layer, a ground layer, and one or a plurality of intermediate layers located between the first circuit layer and the ground layer, a plurality of planar spiral inductors connected in parallel are formed on the first circuit layer, one ends of the plurality of inductors are connected to each other and respectively connected to one end of a first capacitor, the other ends of the plurality of inductors are respectively connected to one ends of a plurality of second capacitors, and the other ends of the plurality of second capacitors are all grounded.

2. The radio-frequency power converter according to claim 1, wherein the first circuit layer is a top circuit board of the printed circuit board.

3. The radio-frequency power converter according to claim 1, wherein the first capacitor and the plurality of second capacitors are provided on one of the one or a plurality of intermediate layers.

4. The radio-frequency power converter according to claim 1, wherein the intermediate layer where the first capacitor and the plurality of second capacitors are located and the ground layer are adjacent circuit layers.

5. The radio-frequency power converter according to claim 4, wherein the first capacitor and the plurality of second capacitors are chip capacitors formed on the intermediate layer, respectively.

6. The radio-frequency power converter according to claim 5, wherein the plurality of inductors are connected to the first capacitor or to the plurality of second capacitors respectively through first through holes provided on the printed circuit board, and the first capacitor and the plurality of second capacitors are connected to the ground layer respectively through second through holes provided on the printed circuit board.

7. The radio-frequency power converter according to claim 1, wherein the first capacitor and the plurality of second capacitors are standard capacitors soldered on the first circuit layer respectively.

8. The radio-frequency power converter according to claim 1, wherein each planar spiral inductor has a square shape as a whole, and the side length of the square shape is less than 5 cm.

9. The radio-frequency power converter according to claim 1, wherein the radio-frequency power converter is a radio-frequency power distributor, wherein one ends of the plurality of inductors connected to the first capacitor are used for receiving a power signal to be distributed, and one ends of the plurality of inductors respectively connected to the plurality of second capacitors are used for outputting a plurality of power distribution signals obtained by distributing the received power signal to be distributed.

10. The radio-frequency power converter according to claim 1, wherein the radio-frequency power converter is a radio-frequency power synthesizer, wherein one ends of the plurality of inductors respectively connected to the plurality of second capacitors are used for respectively receiving power signals to be synthesized, and one ends of the plurality of inductors connected to the first capacitor are used for outputting a power synthesis signal obtained by synthesizing the plurality of power signals to be synthesized.

11. A radio-frequency transmission system for magnetic resonance imaging, comprising:
a radio-frequency generator configured to output a radio-frequency power signal;
a driving amplifier configured to perform primary amplification on the radio-frequency power signal;
a radio-frequency power distributor wherein one ends of the plurality of inductors connected to the first capacitor are used for receiving a power signal to be distributed, and one ends of the plurality of inductors respectively connected to the plurality of second capacitors are used for outputting a plurality of power distribution signals obtained by distributing the received power signal to be distributed, and one ends of the plurality of inductors connected to the first capacitor are used for receiving the primarily amplified radio-frequency power signal from the driving amplifier, and one ends of the plurality of inductors respectively connected to the plurality of second capacitors are used for outputting a plurality of power distribution signals obtained by distributing the primarily amplified radio-frequency power signal;
a plurality of final amplifiers respectively configured to amplify the plurality of power distribution signals; and
the radio-frequency power synthesizer according to claim 10, wherein one ends of the plurality of inductors respectively connected to the plurality of second capacitors are used for receiving the power distribution signals amplified by the plurality of final amplifiers respectively, and one ends of the plurality of inductors connected to the first capacitor are used for outputting a power synthesis signal, the power synthesis signal being a power synthesis signal obtained by synthesizing the plurality of amplified power distribution signals.

12. The radio-frequency transmission system according to claim 11, further comprising a secondary radio-frequency power synthesizer, which comprises a radio-frequency power synthesizer wherein one ends of the plurality of inductors respectively connected to the plurality of second capacitors are used for respectively receiving power signals to be synthesized, and one ends of the plurality of inductors connected to the first capacitor are used for outputting a power synthesis signal obtained by synthesizing the plurality of power signals to be synthesized, and one ends of a plurality of inductors in the secondary radio-frequency power synthesizer respectively connected to the plurality of second capacitors are used for receiving a plurality of power synthesis signals output by a plurality of the radio-frequency power synthesizers respectively, and one ends of the plurality of inductors in the secondary radio-frequency power synthesizer connected to the first capacitor are used for outputting a secondary power synthesis signal, the secondary power signal being a secondary power synthesis signal obtained by synthesizing the plurality of power synthesis signals.

13. The radio-frequency power converter according to claim 11, wherein an output impedance of the radio-frequency power distributor is equal to an input impedance of the corresponding final amplifier, and an input impedance of the radio-frequency power synthesizer is equal to an output impedance of each final amplifier.

14. The radio-frequency power converter according to claim 11, wherein the output impedance of the radio-frequency power distributor and the input impedance of the radio-frequency power synthesizer are both less than 10 ohms.

15. The radio-frequency power converter according to claim 12, wherein each planar spiral inductor in the radio-frequency power distributor and the radio-frequency power synthesizer has a square shape as a whole, and the side length of the square shape is less than 4 cm.

* * * * *